United States Patent
Rittmann et al.

(10) Patent No.: US 6,433,275 B1
(45) Date of Patent: Aug. 13, 2002

(54) WATERTIGHT HOUSING FOR ELECTRICAL DEVICES

(76) Inventors: Kenneth W. Rittmann, 3024 Kennington Way; Albert D. Rittmann, 1111 Highland Dr., both of Kokomo, IN (US) 46902

( * ) Notice: Subject to any disclaimer, the term of this patent is extended or adjusted under 35 U.S.C. 154(b) by 0 days.

(21) Appl. No.: 09/771,141

(22) Filed: Jan. 26, 2001

(51) Int. Cl.⁷ .................................................. H01J 5/00
(52) U.S. Cl. ................... 174/50.56; 174/50; 220/4.02; 248/906
(58) Field of Search .............................. 174/50, 48, 58, 174/60, 17 R, 50.56; 220/3.6, 3.8, 4.02; 248/906; 439/535

(56) References Cited

U.S. PATENT DOCUMENTS

| | | | |
|---|---|---|---|
| 3,983,311 A | * 9/1976 | Brumfield et al. | 174/50 |
| 5,148,347 A | 9/1992 | Cox | 361/272 |
| 5,239,129 A | 8/1993 | Ehrenfels | 174/51 |
| 5,248,850 A | 9/1993 | Laney | 174/62 |
| 5,430,248 A | * 7/1995 | Levy | 174/50 |
| 5,914,863 A | * 6/1999 | Shen | 361/752 |

\* cited by examiner

*Primary Examiner*—Dean A. Reichard
*Assistant Examiner*—Dhiru R Patel

(57) ABSTRACT

The invention is a watertight plastic housing for an electrical device, having a base 2, a lid 12 of a size and shape to be friction-induced welded 13 to base 2. The housing has a fixed male-threaded nipple 1, which is hollow (opening 5), permitting wires 10 to pass through a housing wall. When the housing base is friction-induced welded to the lid, a prior art washer is externally seated on the nipple, the nipple is inserted into a hole 15 of a prior art junction box 16, and the nipple is secured to the junction box with a prior art nut, the housing and housing-to-junction box substantially provides a watertight seal.

20 Claims, 2 Drawing Sheets

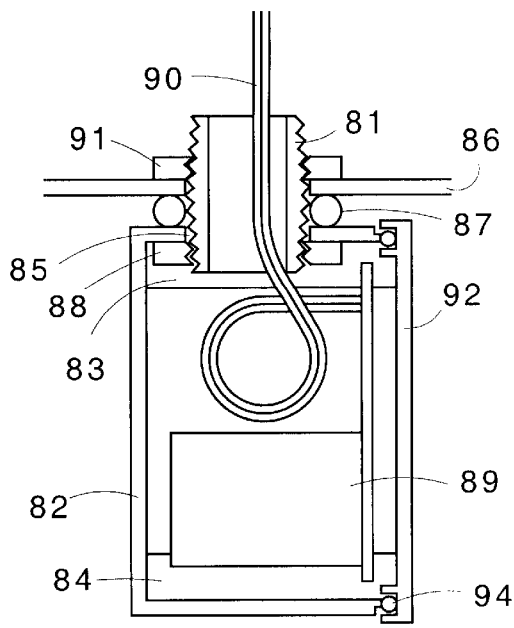
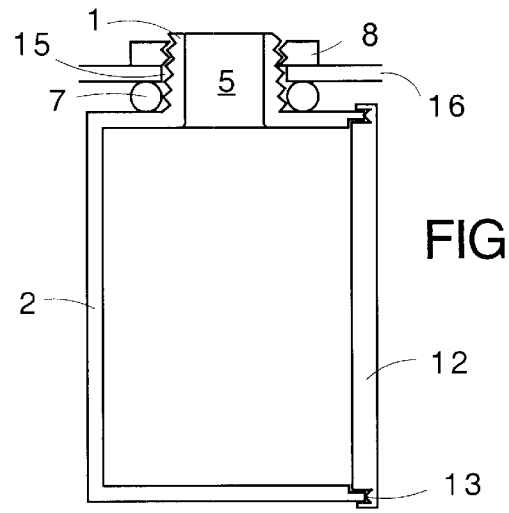
FIG 2
PRIOR ART FIG 1
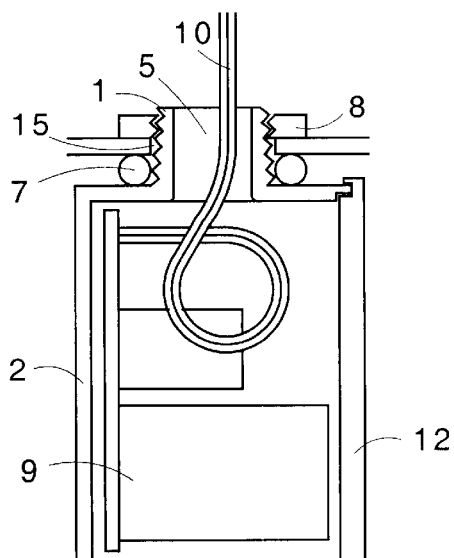
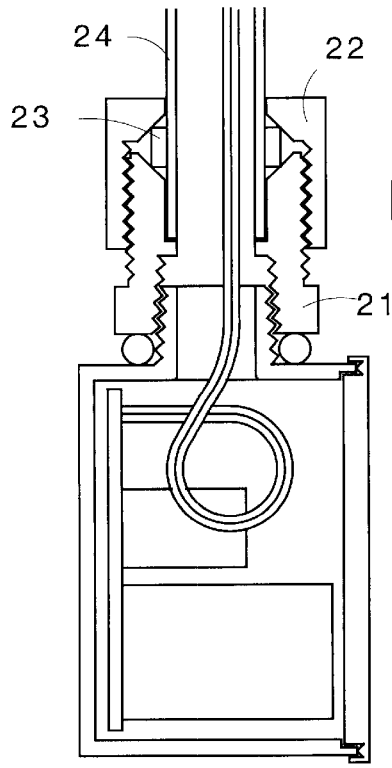
FIG 8
FIG 3

WATERTIGHT HOUSING FOR ELECTRICAL DEVICES

BACKGROUND OF INVENTION

This invention relates to boxes and housings with electric device or mounting means therefor; coupling or mounting means, with stud or nipple and box supporting means. The invention also relates to sealed with box supporting means; or conduit or cable opening, coupling means or hole closures, and/or covers or face plates with closure for face plate opening.

There are instances when electrical equipment must be protected from moisture and dust. NEMA4 and NEMA4X are standards by NEMA* for electrical enclosures that do not allow the ingress of moisture and or dust. Enclosures that satisfy both NEMA4 and NEMA4X are referred to as satisfying NEMA4/4X. Prior art NEMA4 and NEMA4X housings are available with a lid, base, and gasket, attached by means of several screws. An example of such prior art, with an electrical device inside, can be seen in U.S. Pat. No. 5,239,129, entitled HOUSING FOR SWITCHED ELECTRICAL RECEPTACLE OR THE LIKE, by Alfred L. Ehrenfels, Aug. 24, 1993, FIGS. 3, 5 and 6 (discussed on p. 5, lines 16–18). For a NEMA4 seal, all screws must be outside of the lid-to-base sealing gasket. [Screw-holes are often placed within the perimeter of the rectangular shape to reduce overall housing size. When inside the rectangular box, the four screw holes take up limited housing space.] The narrow gasket (narrow in order to not enlarge the housing wall thickness) is difficult and expensive to produce. Setting this specialized gasket is labor-intensive: It is hard to place the rubbery gasket (87) into the narrow rectangular channel (80) of the baas, especially at it's sharp inverted corners near the screw holes. The gasket can shift or fold, especially when compressing the gasket/ screwing down the lid.

The wire feed-out arrangement using prior art housings is labor-intensive: An attached externally-threaded conduit and two internally threaded nuts (65–67) secure through the housings hole (conduit opening 39). The junction box side, to which the device is to be attached, then requires an equal number of operations, plus another two additional internally threaded nuts. So housing-to-junction-box attachment requires an extensive number of hand-screwing operations. For a watertight seal, a washer would also be attached between the housing and external nut 66.

Another (simpler) mounting arrangement is shown in Prior Art FIG. 1, Housing base 82 knock-out 85 is punched out (like with a screwdriver/hammer), nut 88 is screwed inside onto close-nipple 81, and electronics 89 are inserted. [A close-nipple is the given name of the short, male metal nipple piece, with beveled ends, as pictured.] As the electronics are so packed in the small housing, wires 90 can get scraped when angularly fed (from strain-relief fold-over: drawn as a loop) through occasionally-internally-sharp metal nipple 81. Often there is barely room for the electronics, strain-relief, fold-over, and the nut; making nut retainment very difficult. The nut must be turned or held in place in very cramped quarters of the housing. Without an exterior nut, close-nipple 81 is still loose against the housing when shipped to the installer. Lastly, lid 92, with gasket 94, is 4-screwed (screw posts 83 and 84 shown) to the housing base.

Though the housing may meet NEMA4 standards when it leaves the manufacturer, its water-seal is easily compromised at installation: An installer must slide rubber washer 87 over the close-nipple, all the way to outer surface of housing base 82, extend the close-nipple through the opened junction-box knock-out, hold the housing tight against wall of junction box 86, and apply/tighten nut 91. If the washer isn't fully seated, or the nipple is not held tight to the junction box, the washer can end up a distance away from the housing, therein not water-sealing the junction. The problem is the close-nipple can be loose, with the nut loose, against the inner surface of the housing when the installer gets it (close-nipple 81 only secured by internal nut 88). If the close-nipple is not pulled out fight from the housing, and isn't held exactly perpendicular to the housing while pushing on the washer, the washer won't be seated properly.

The nipple tends to be sizeably smaller in diameter than a junction-box knock-out. The rubbery washer may float with respect to the junction box and housing. As the junction box nut is tightened, the washer can squish into the clearance space between the outside surface of the close-nipple and the inside surface of the junction box knock-out. This will trap and deform the washer, further compromising the water-seal. [The gasket can start out a distance from the housing and it could be caught between the inside diameter of the knockout and the outside diameter of the close-nipple.]

If a nut restraint were molded into a prior-art housing at a knock-out, that would prevent prior-art seating problems, but such a restraint would take up valuable housing space (which is why no such housing is known to exist)

Again, as the wires are pulled through, the close-nipple's potentially-sharp internal corners can scrape off insulation. [This can cause the electrical grounding of the affected wires, and/or cause a malfunction of the overall system.]

In all, the installer is mainly concerned with feeding through and screwing down the wires leading out of the housing into the junction box. Because of this, the difficulty of securing the housing properly may often lead to a compromised watertight seal.

Prior-art NEMA4/4X enclosures are available with an opaque base and with an opaque, transparent or translucent lid, with the gasket retained by lid or base.

Another prior-art method of forming a NEMA4/4X seal is applying a rubber-like material that cures to form a gasket, often with a hypodermic needle. This can be labor intensive and leave globs of material on the outside of the housing. Even with a cured gasket, the lid is still secured with screws.

There are various methods of welding plastic parts, one to another. Some of these methods utilize friction-induced heating to momentarily melt the plastic while the parts are held together. When the friction-induced heating is discontinued, the plastic rapidly hardens to provide a watertight seal between the two parts. These methods include but are not limited to Ultrasonic Welding, Linear Vibration Welding, Orbital Vibration Welding, and Spin Welding. The advantages and disadvantages of each of these methods of welding are taught in the referenced sales literature of Branson—Applied Technologies Group * * * * * . The term friction-induced welding' is used for all of these welding methods in text and claims.

There are a multitude of prior art energy director configurations for ultrasonic plastic welds. An example of a prior art energy director configuration can be seen in U.S. Pat. No. 5148347; entitled Polymer-Encased Electrical Capacitor with Pressure Sensitive Circuit Interrupter, by Michael E. Cox, Sept. 15, 1992. Also the prior art energy director configurations are taught in the referenced Branson Ultrasonics Corporations Technical Information PW-3 * * * *.

Functional Devices, the Assignee of this patent, has prior-art produced a variety of opaque plastic housings with attached nipples * * * , including their Model RIBU1C (a pre-assembled relay in a housing). [An indicating LED (light emitting diode) also protrudes from a hole in this housing.] Such devices/housings were not NEMA4 rated, have no gasket between the base and the lid, and their lids were secured with as little as one screw. [Such a screw was positioned inside of the housing cavity area, thereby making the NEMA4 rating impossible.] In the past, other manufacturers have made plastic housings with nipples. Currently Functional Devices, and a competitor, [who began exactly reproducing Functional Devices RIBU1C product-plus-housing four years ago], manufacture nippled housings for relays, responders and the like.

BRIEF SUMMARY OF THE INVENTION

The invention is a watertight plastic housing for an electrical device, having a base 2, a lid 12 of a size and shape to be friction-induced welded 13 to base 2. The housing has a fixed male-threaded nipple 1, which is hollow (opening 5), permitting wires 10 to pass through a housing wall. When the housing base is bonded to the lid, a washer is externally seated on the nipple, the nipple is inserted into a hole 15 of a prior art junction box 16 and the nipple is secured to the junction box with a prior art nut 8, the housing and housing-to-junction box substantially provides a watertight seal.

ADVANTAGES OF THE INVENTION

This water-seal enclosure invention provides relief from the high cost of manufacturing a gasket; and multiple conduit, washer, and pipe parts. The invention provides relief from intensive labor/cost: punching out the knock-out of the housing, screwing together the housing/conduit/washer,/pipe parts, seating the gasket, and 4-screwing the lid down.

The elimination of the sharp metal close-nipple eliminates the scraping of insulation off of fed-through wires. The elimination of the gasket reduces the possibility of errors in its seating. The absence of possible scraping and water-seal (washer-seating) errors at installation greatly reduces the possibility of system errors and failures.

Replacing the loosely held close-nipple with a fixed nipple and placing the washer on the nipple under controlled manufacturing conditions assures that the washer won't float and likely won't catch/deform/compromise the seal at the junction box.

Because a wide surface of the housing butts directly up against the junction box, the box's washer won't float and likely won't catch/deform/compromise the seal at the box. Because the lid-attachment screws have been eliminated, the enclosure has more internal space.

The lid's lip centers precicely to the base lip, unlike lids with gaskets. A housing base lip for a friction-induced weld can have radially thinner housing lips than housings made to use gaskets [A peripheral friction-induced weld base needs only an inner ledge, whereas a gasket needs a trench to retain the gasket.]

BRIEF DESCRIPTION OF THE DRAWINGS

FIG. 1 is a prior art housing-to-box attachment, cross-sectional view

FIG. 2 shows an installed housing-to-junction box attachment, cross-sectional view.

FIG. 3 shows the embodiment of FIG. 2 with an electrical device

FIG. 8 shows an installed housing-conduit attachment, cross-sectional view.

DESCRIPTION OF THE NOTATIONS

Figure 4:
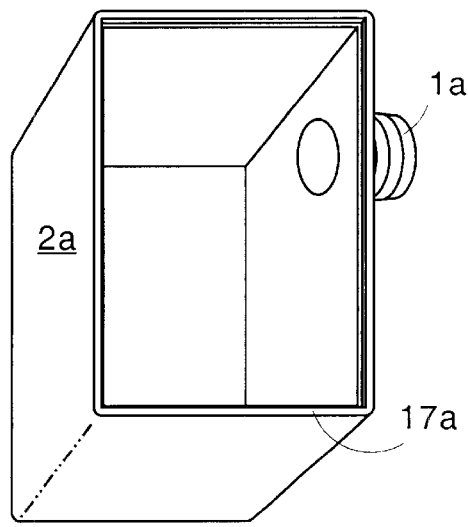
FIG. 4 is an embodiment of a housing base, top perspective view

1 is a male nipple
2 is a housing base
3 is a feed-through screw hole
4 is a feed-through screw hole
5 is a nipple opening
7 is a rubber washer
8 is a nut
9 is an electrical device
10 are wires
12 is a housing lid wall
13 is a friction-induced weld
14 is an energy director
15 is a junction box knock-out
16 is a junction box
17 is a base/first lip
18 is a lid/second lip
21 is a M/F threaded body
22 is an end nut
23 is a rubber seal
24 is a conduit
81 is a close-nipple
82 is a housing base
83 is a screw post
84 is a screw post
85 is a housing knock-out
86 is a junction box
87 is a rubber washer
88 is a housing nut
89 is an electrical device
90 are wires
91 is a junction box nut
92 is a lid
94 is a gasket Notations a and b describe different embodiments of the invention. (No sub-letter indicates all versions of the invention.)

DESCRIPTION OF THE INVENTION

1. Description of One Embodiment of the Invention

FIG. 2 shows an installed watertight enclosure /housing-to-junction box attachment, cross-sectional view. The enclosure/housing has housing base 2 with fixed male nipple 1, lid 12, and friction-induced weld 13. Prior-art nut 8, washer 7, junction box 16, and junction box knock-out 15 are noted. Weld 13 is actually drawn as the point of an energy director before a weld.

FIG. 3 shows the embodiment of FIG. 2 with an electrical device. The manufacturer simply places washer 7 over nipple 1, feeds wire(s) 10 through opening 5 of nipple 1, lowers electrical device 9 into base. 2, and bonds lid 12 onto base 2. The installer punches/drills out box knockout 15, slips nipple 1 into the knock-out, slips on/screws down nut 8, then connects the free end of wire(s) 10 (often to junction box terminals).

The washer forms a seal between the junction box and the face of the housing, concluding a water-tight seal for the housed device up to the internal side of the junction box. As the junction box's water-tightness is not within the inspection of the housed device manufacture, it is not claimed.

2. Description of Other Embodiments of the Invention

Embodiment parts of a housing of the invention are shown in FIGS. 4 through 7.

FIG. 4 is an embodiment of a housing base, top perspective view. Base 2a and nipple 1a are noted. Base/first lip 17a is peripheral to the cavity of the base, and supported by a plurality of side walls. The base/first lip can be said to be substantially opposite the bottom wall in an embodiment. The base/first lip includes top edges of the side walls. This lip is of a shape and size to be friction-induced welded to a lid lip, like 18a of FIG. 6. As there are many configurations of such prior art lip designs * * * * , none are specified. When either a portion of the base lip or lid lip protrude downwardly (a common configuration), the base centers perfectly to the lid. This housing base is injection molded.

Figure 5:
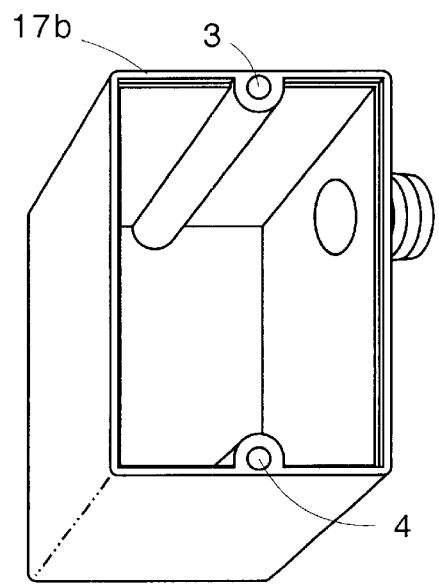
FIG. 5 is an embodiment of a housing base, with feed-through holes, top perspective view

FIG. 5 is an embodiment of a housing base, top perspective view, showing feed-though screw holes 3 and 4 and base/first lip 17b. The screw holes, external to the housing's central cavity, can be used to mount the housing by a means other than the nipple (as to a flat surface), like if the nipple is water sealed to a conduit or jacketed cable.

Figure 6:
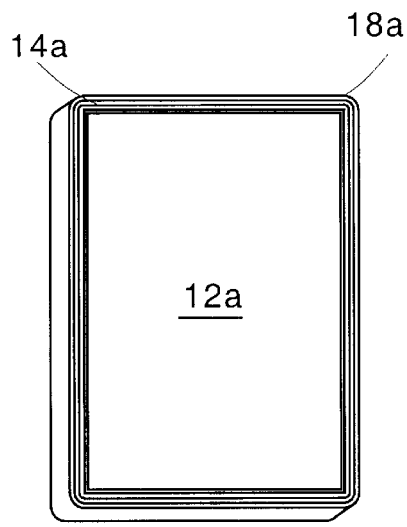
FIG. 6 is an embodiment of a housing lid, to mate with base in FIG. 4, bottom perspective view

FIG. 6 is an embodiment of a housing lid, to mate with base in FIG. 4, bottom perspective view. Lid wall 12a is noted. This housing lid is injection molded. Energy director 14a and and lid/second lip 18a continue around the periphery of the internal cavity of the base. With or without an energy director, a friction-induced weld/seal is at least around the periphery of the internal cavity formed by the base/lid. This seal is between base/first lip and lid/second lip.

Figure 7:
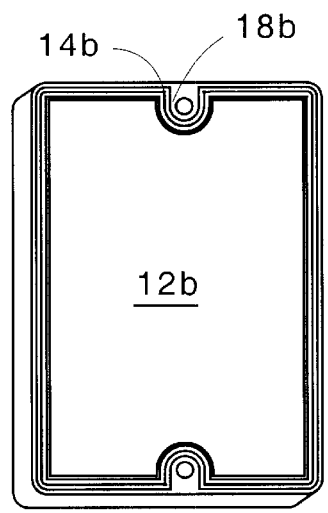
FIG. 7 is an embodiment of a housing lid, to mate with base in FIG. 5, bottom perspective view

FIG. 7 is an embodiment of a housing lid, to mate with base in FIG. 5, bottom perspective view. Lid wall 12b is noted. Energy director 14b and lid/second lip 18b continue around the periphery of the internal cavity of the base. The feed-through holes are shown external to the energy director periphery. With or without an energy director, a friction-induced weld/seal between base and lid is at least internal to the feed-through holes.

A conduit or jacketed cable can be an external entity. FIG. 8 shows an installed housing-conduit attachment, cross-sectional view. The watertight plastic housing is the same as that in FIG. 2. [I.e., the base is friction-induced welded to the lid, and a prior art washer is externally seated on the nipple] The nipple is inserted/secured-to prior art conduit 24 with M/F body 21, rubber seal 23, and female end nut 22. The housing and housing-to-conduit connection forms substantially a watertight seal. This same attachment arrangement depicts connection to a jacketed cable. Same or alternate-sized M/F body, rubber seal, and female end nut may be used for a jacketed cable. Cable Glands * * * , from BUD Industries provides a variety of similar-type prior-art parts. Such prior art cable glands are not suitable for an embodiment of the housing invention. However, the glands describe a male/male version of a housing-conduit attachment. The invention requires a male/female housing-conduit attachment.

3. Materials and Dimensions

The device, orientation of the device, and number or size of wire(s) attached to the device are not pertinent to the invention. However the device may include a relay, transformer, light sensor, or other electrical devices, and may include supporting electronic components (like a circuit board, resisters, capacitors diodes & LEDs, etc).

The following dimensions can be, but are not limited to being, the dimensions identified as follows: internal dimension of nipple: 0.5", external dimension of nipple: 0.82", external enclosure box length: 2.78" width: 1.66", and heighth: 1.61". All embodiments are drawn to the same scale. Wires can be 18 gauge, but wires of nearly any gauge can be used. The length of wires varies according to whatever the housing/device is to be connected to.

Many injection moldable plastics may be used for a housing lid, nipple, and/or base, including but not limited to Polyvinyl Chloride, Acrylonitrile Butadiene Styrene, Polyphenylene Ether+Polystyrene, polycarbonate, resins such as Grilamid®, Ultem®, or blends of any of the preceding materials. [Resins are considered plastics for the text and claims.] A housing lid may be transparent, opaque, or translucent. A housing base may be transparent, opaque, or translucent. A housing lid and/or base can also be partially translucent, partially transparent and partially opaque. This is often created by injecting two different plastics in the mold and/or texturing the mold differently in different places. A transparent or translucent lid and/or base can allow an LED of an enclosed device to be visible through the housing. Rubber seal is a prior art given name for the seal shown in FIG. 8, but such a seal is not limited to being made of rubber, as it is often made of rubber-like material.

The fixed nipple can protrude from any of the six sides of the housing, including the lid. Therein, the side from which the inventions' nipple protrudes is not specified in the invention. A housing lid, nipple, and base together constitute a housing.

An external entity for watertight attachment to the housing can be a junction box, conduit or jacketed cable. A junction box, in this text and claims, can be any box used to make connections (junctions) in an overall electrical system (and is usually made of metal or plastic). A junction box can be a control housing, or any housing having a knock-out or having the capability of being drilled or punched to produce a hole equivalent to a knocked out knock-out. A junction box hole is, of average, a 0.875" diameter circular knock-out.

As attachment of a housed device to a junction box is done by an installer, (not the manufacturer), and a rubbery washer is a prior art item, the housed device may or may not be shipped with the washer.

An electrical device can include, but is not limited to including, a relay, a transformer, light sensor, or any electrical device; plus other miscellaneous electronic components, often on a circuit board.

The housing is shown in the embodiments as substantially rectangular, (in cross-section), but can be of other shapes including but not limited to substantially triangular, polygon, circular, or elliptical. In example: a spherical embodiment would have a substantially circular cross-section, and may include contiguous, spherically-curved side walls, and bottom wall, and a spherically-curved lid wall. Any wall can be flat, or at least partially convex or concave. Energy directors are shown as part of a housing lid, but can instead be part of a housing base, or not used at all. The plastic of the energy director becomes part of the friction-induced weld when the lid and base are friction-induced welded/fuzed together.

The washers are often called gaskets by installers and others. The term washer is used so as not to confuse it with the lid/base rectangular gaskets discussed.

4. Conclusion

An embodiment can be a watertight plastic housing for containing an electrical device, and for availing connection of that device to an external entity by wires transcending from inside to outside the housing. The housing has a plastic base having a bottom wall and a plurality of contiguous side walls. The housing has a base/first lip supported by the plurality of contiguous side walls. The housing has a lid having a top wall and a peripheral second lip. The second lip confronts the base's first lip in such a manner that the lips can be friction-induced welded to each other. The housing has a male-threaded nipple fixed/integral to a wall of the housing. The nipple is hollow, permitting wires to pass through a housing wall.

An embodiment can be a watertight plastic housing connected to a junction box, conduit or jacketed cable. In use: The housing base is friction-induced welded to the housing lid, a prior art washer is externally seated on the housing nipple, the nipple is inserted into a hole of a prior art connection means or external entity. When the external entity is a junction box, a prior art washer is externally seated on the nipple, the nipple is inserted into a junction box hole, and said nipple is secured to the junction box with a prior art nut. This housing and housing-to-junction box assembly substantially provides a watertight seal.

When the external entity is a conduit or jacketed-cable: a prior art washer is externally seated on the housing nipple; and the nipple is secured to a prior art M/F body, prior art rubber seal, and prior art female end nut. The housing and housing-to-conduit [or housing-to-jacketed-cable] substantially provides a watertight seal.

Previous housings with fixed nipples had other open holes (like an LED hole), and/or a 1 to 4-screw lid arrangement. This shows the value of a fixed nipple was not previously recognized as an improved water-seal (over a separate beveled nipple and parts, like in P.A. FIG. 1). The invention recognizes that the combination fixed nipple and friction-induced welding sealed lid' together provide a unique NEMA4/4X rated device that is less costly in parts and labor, increases limited internal housing space, reduces installer errors, and avoids inadvertent wire insulation-stripping.

I claim:

1. A plastic-housing-containing-an-electrical-device assembly, said device comprising substantially a relay and wires;
    said housing comprising:
        a plastic base having a bottom wall, and a plurality of contiguous side walls,
        a first lip supported by the said plurality of contiguous side walls,
        a lid having a top wall and a peripheral second lip,
        a male-threaded nipple fixed to a wall of said housing,
        said nipple being hollow, said wires passing from inside to outside said
    housing through said hollow,
        portions of said housing being partially translucent, partially transparent and partially opaque,
        said second lip confronting said first lip,
        said second lip and said first lip each of a size and shape to be
    watertight friction welded to each other; and
    said assembly further including
        a rubbery washer, said washer externally seated on said nipple.

2. The assembly of claim 1, wherein
    said second lip is friction induced welded to said first lip; such that said weld substantially provides a watertight seal between said base and said lid.

3. The assembly of claim 2, further including:
    a nut and a junction box;
    said junction box having a hole;
    said nipple is inserted into said hole; and
    said nipple is secured to said junction box with said nut;
    wherein said housing to said junction box substantially provides a watertight seal.

4. The assembly of claim 2, wherein said lid is transparent.

5. The assembly of claim 2, wherein said base is transparent.

6. The assembly of claim 2, wherein said lid is translucent.

7. The assembly of claim 2, wherein said base is translucent.

8. The assembly of claim 2, wherein said base is partially translucent, partially transparent and partially opaque.

9. The assembly of claim 2, further including a conduit, a rubber seal, and a nut; said nipple is secured in said conduit, said conduit is secured in said rubber seal, and said rubber seal is secured in said nut; wherein said housing to said conduit substantially provides a watertight seal.

10. The assembly of claim 2, further including a jacketed cable, a rubber seal, and a nut; said nipple is secured in said cable, said cable is secured in said rubber seal, and said rubber seal is secured in said; wherein said housing to said cable substantially provides a watertight seal.

11. A plastic-housing-containing-an-electrical-device assembly, said device comprising a transformer and wires; said housing comprising:
- a plastic base having a bottom wall, and a plurality of contiguous side walls,
- a first lip supported by the said plurality of contiguous side walls,
- a lid having a top wall and a peripheral second lip,
- a male-threaded nipple fixed to a wall of said housing,
- said nipple being hollow, said wires passing from inside to outside said
- housing through said hollow,
- portions of said housing being partially translucent, partially transparent and partially opaque,
- said second lip confronting said first lip,
- said second lip and said first lip each of a size and shape to be
- watertight friction welded to each other; and
- said assembly further including
  - a rubbery washer, said washer externally seated on said nipple.

12. The assembly of claim 11, wherein
- said second lip is friction induced welded to said first lip;
- such that said weld substantially provides a watertight seal between said base and said lid.

13. The assembly of claim 12, further including:
- a nut and a junction box;
- said junction box having a hole;
- said nipple is inserted into said hole; and
- said nipple is secured to said junction box with said nut;
- wherein said housing to said junction box substantially provides a watertight seal.

14. The assembly of claim 12, wherein said lid is transparent.

15. The assembly of claim 12, wherein said base is transparent.

16. The assembly of claim 12, wherein said lid is translucent.

17. The assembly of claim 12, wherein said base is translucent.

18. The assembly of claim 12, wherein said base is partially translucent, partially transparent and partially opaque.

19. The assembly of claim 12, further including a conduit, a rubber seal, and a nut; said nipple is secured in said conduit, said conduit is secured in said rubber seal, and said rubber seal is secured in said nut; wherein said housing to said conduit substantially provides a watertight seal.

20. The assembly of claim 12, further including a prior art jacketed cable, prior art M/F body, prior art rubber seal, and prior art female end nut;
- said nipple is secured in said M/F body, said cable is secured in said rubber seal, and said seal and said M/F body are secured in said end nut; wherein
- said housing to said cable substantially provides a watertight seal.

* * * * *